United States Patent [19]

Shannon

[11] Patent Number: 4,626,884
[45] Date of Patent: Dec. 2, 1986

[54] OPTICALLY-SENSITIVE SEMICONDUCTOR DEVICES

[75] Inventor: John M. Shannon, Whyteleafe, England

[73] Assignee: U.S. Philips Corporation, New York, N.Y.

[21] Appl. No.: 672,027

[22] Filed: Nov. 16, 1984

[30] Foreign Application Priority Data

Dec. 20, 1983 [GB] United Kingdom ............... 8333817

[51] Int. Cl.$^4$ ...................... H01L 27/14; H01L 31/00
[52] U.S. Cl. ........................................ 357/30; 357/16;
357/15; 357/52; 357/53
[58] Field of Search ...................... 357/53, 30, 52, 15,
357/36, 34, 16

[56] References Cited

U.S. PATENT DOCUMENTS 4,149,174 4/1979 Shannon ............................... 357/34

Primary Examiner—James W. Davie
Assistant Examiner—Georgia Y. Epps
Attorney, Agent, or Firm—Robert T. Mayer; Steven R. Biren

[57] ABSTRACT

A semiconductor device, having an optically-sensitive barrier region which is substantially fully depleted at zero bias and in the absence of light, is switchable between a high voltage blocking state and a high current state by means of incident light. The barrier region contains a net impurity concentration of opposite conductivity type to that of first and second regions between which it is located and is divided laterally into plural areas located between deeper closely-spaced field-relief regions. In the absence of incident light and with reverse bias of the barrier region the device has a high voltage blocking characteristic due to depletion layers from neighboring field-relief regions merging together to reduce the electrostatic field below the barrier region.

9 Claims, 4 Drawing Figures

OPTICALLY-SENSITIVE SEMICONDUCTOR DEVICES

BACKGROUND OF THE INVENTION

This invention relates to semiconductor devices having an optically-sensitive barrier region which is substantially fully depleted at zero bias and in the absence of incident light, and in particular to such devices which are switchable between a high voltage blocking state and a high current state by means of incident light.

U.S. Pat. No. 4,149,174 discloses several forms of semiconductor devices comprising a semiconductor body having first and second regions of one conductivity type and a barrier region located between the first and second regions to control current flow along a current path between the first and second regions. The barrier region contains a net impurity concentration of the opposite conductivity type and is at least substantially fully depleted of free charge carriers by depletion layers formed with the first and second regions at zero bias, at least in the absence of incident light. These devices are of the unipolar type in which the current flow through the barrier region is by majority carriers (i.e. charge carriers of said one conductivity type) and so can have a high switching speed.

FIG. 6 of U.S. Pat. No. 4,149,174 illustrates a photon detector as one form of such a device. In this case the barrier region is optically-sensitive, and optically transmissive means (in the form of a window in an electrode layer) permit incident light to generate charge carriers in the vicinity of the barrier region to reduce the barrier height of the barrier region. Minority carriers (i.e. charge carriers of said opposite conductivity type) generated in electron-hole pairs by the light are collected in the barrier region thereby modulating the barrier height and the magnitude of the majority carrier current flow through the barrier region. It is suggested that the FIG. 6 device structure may be used as a low photon level detector with high quantum efficiency and gain.

In most of the embodiments shown in U.S. Pat. No. 4,149,174 both the first and second regions adjoin a surface of the body, and the first region is laterally bounded by a single undepleted annular zone of the opposite conductivity type which laterally separates the first region from part of said second region. This annular zone extends sufficiently deeply in the body to intersect the edge of the barrier region so as to terminate the barrier region laterally in the annular zone and thereby to act also as a guard ring for the barrier region. In some embodiments (including the FIG. 6 photon detector) this annular zone is formed in the same doping step used to form the barrier region and extends to the same depth in the body as the barrier region. However in other embodiments the annular zone is provided in a separate doping step so as to form a higher barrier, and in this case it extends generally deeper than the barrier region.

U.S. Pat. No. 4,149,174 does not disclose any specific device designed for blocking high voltages, for example voltages of at least 50 volts. Thus, for example, FIG. 5 of U.S. Pat. No. 4,149,174 illustrates a reverse-biased characteristic for such a barrier region up to 16 volts, after which the reverse leakage current begins to increase significantly as a result of a high electrostatic field in the depleted area of the second region adjacent the barrier region. This field pulls the barrier down and results in unacceptably large reverse currents at high voltages.

SUMMARY OF THE INVENTION

The present invention permits devices having a depleted barrier region between first and second regions of one conductivity type to be used for blocking high voltages and to be switchable at high speeds between the high voltage blocking (OFF) state and a higher current (ON) state.

According to the present invention there is provided a semiconductor device comprising a semiconductor body having first and second regions of one conductivity type and an optically-sensitive barrier region located between the first and second regions to control current flow along a current path between the first and second regions, which barrier region contains a net impurity concentration of the opposite conductivity type and is at least substantially fully depleted of free charge carriers by depletion layers formed with the first and second regions at zero bias and in the absence of incident light, and optically transmissive means permitting incident light to generate charge carriers in the vicinity of the barrier region to reduce the barrier height of the barrier region, characterized in that the barrier region is divided laterally into plural areas located between closely-spaced field-relief regions which protrude to a greater depth in the body than the barrier region, and that in the absence of incident light and with reverse bias of the barrier region the device has a high voltage blocking characteristic due to the field-relief regions being sufficiently closely spaced that depletion layers extending in the second region from neighboring field-relief regions merge together under reverse-bias of the barrier region to reduce the electrostatic field below the barrier region, the device being switchable between the high voltage blocking state and a higher current state by means of incident light.

In such a device in accordance with the invention, the closely-spaced field-relief regions between which the plural barrier-region areas are located serve to reduce the electrostatic field below the barrier region by depleting the second region over a greater depth below the barrier region, thereby permitting the barrier region to block high reverse voltages, whereas because of its optically-sensitive nature the barrier can be made to collapse quickly by the incidence of light, so switching the device quickly into a higher current state in which the blocking is no longer effective. By having a large (but divided) area for the barrier region a large current of majority carriers can flow between the first and second regions in the ON state. Furthermore, the device can return to its blocking state quickly after the incident light is switched off, because the current flow is of majority carriers.

The arrangement and geometry of the field-relief regions and the plural barrier-region areas can be optimized so as to increase the optical sensitivity of the barrier region and the switching speed of the device from the blocking state to the ON state and from the ON state to the blocking state. Thus, in one form the plural barrier-region areas extend laterally to the field-relief regions; this permits the device to have a high switching speed from the ON state into the high voltage blocking state, because minority carriers which were generated by the incident light and collected in the barrier region can flow laterally into the field-relief regions. This form of the device is particularly advantageous for rapid extraction of these minority carriers when an electrical connection to the first region is also connected to the field-relief regions. Thus, the first region may be divided laterally into plural areas located between the field-relief regions, and an electrical connection to the first region may be made by an electrode layer which contacts the field-relief regions and the plural first-region areas.

In another form, the plural barrier-region areas are separated laterally from the field-relief regions by areas of the second region. In this case it can be difficult for minority carriers generated by the incident light to escape from the barrier region, and this enhances the optical sensitivity of the barrier region in switching quickly from the blocking state to the ON state when the device is illuminated by the light. However, if these minority carriers collected by the barrier region cannot rapidly flow away, the switching speed from the ON state to the blocking state will be slower as a result of the decay time of the minority carriers.

BRIEF DESCRIPTION OF THE DRAWING

These and other features in accordance with the present invention and further advantages will now be described with reference to the accompanying diagrammatic drawings illustrating, by way of example, two different embodiments of the invention. In these drawings.

Figure 1:
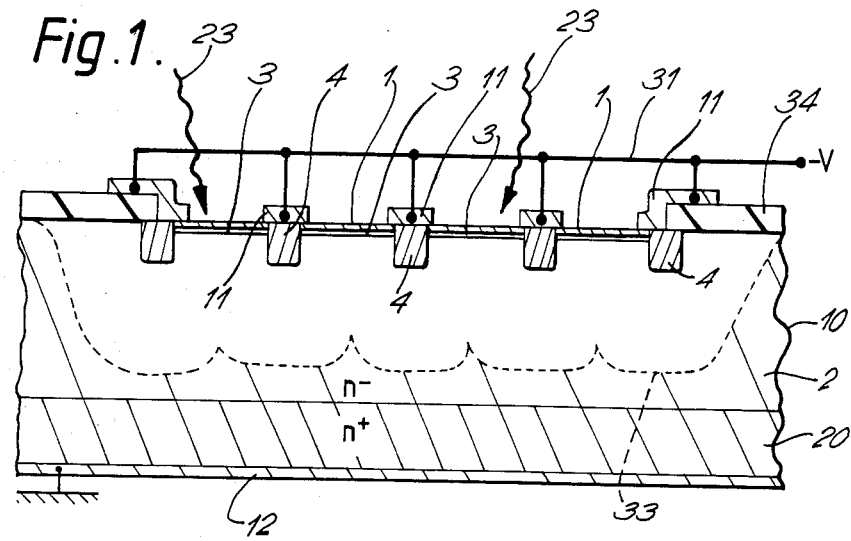
FIG. 1 is a cross-sectional view of a high voltage optically-switchable semiconductor diode in accordance with the invention.
Figure 3:
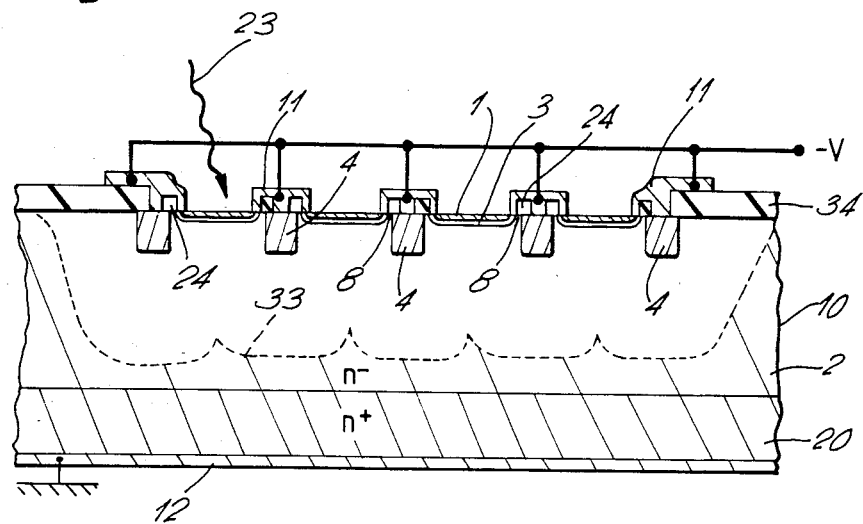
FIGS. 3 and 4 are cross-sectional views of further high voltage optically-switchable semiconductor diodes in accordance with the invention.
Figure 4:
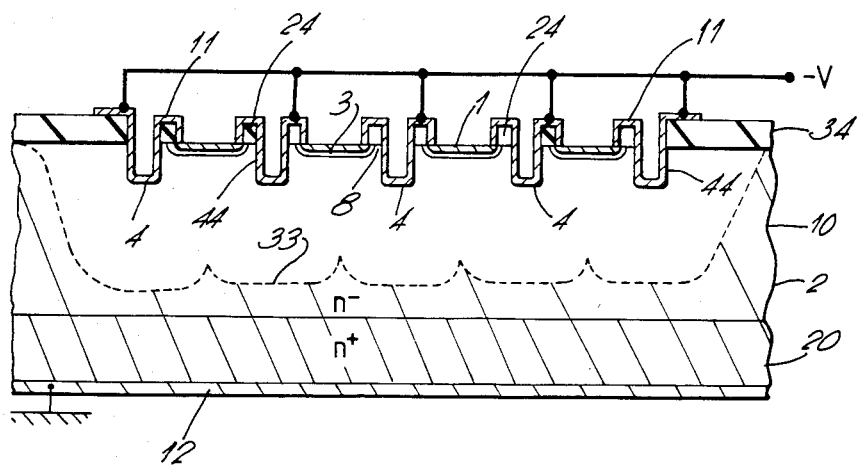

It should be noted that all the Figures are diagrammatic and not drawn to scale. The relative dimensions and proportions of various parts of these Figures have been shown exaggerated or reduced for the sake of clarity and convenience in the drawing. In the cross-sections of FIGS. 1, 3 and 4 areas of the body which are depleted of charge-carriers by the depletion layers are not hatched for the sake of clarity. The same reference signs as used in one Figure are also generally used to refer to corresponding or similar parts in the other Figures.

DESCRIPTION OF THE PREFERRED EMBODIMENTS

Figure 2:
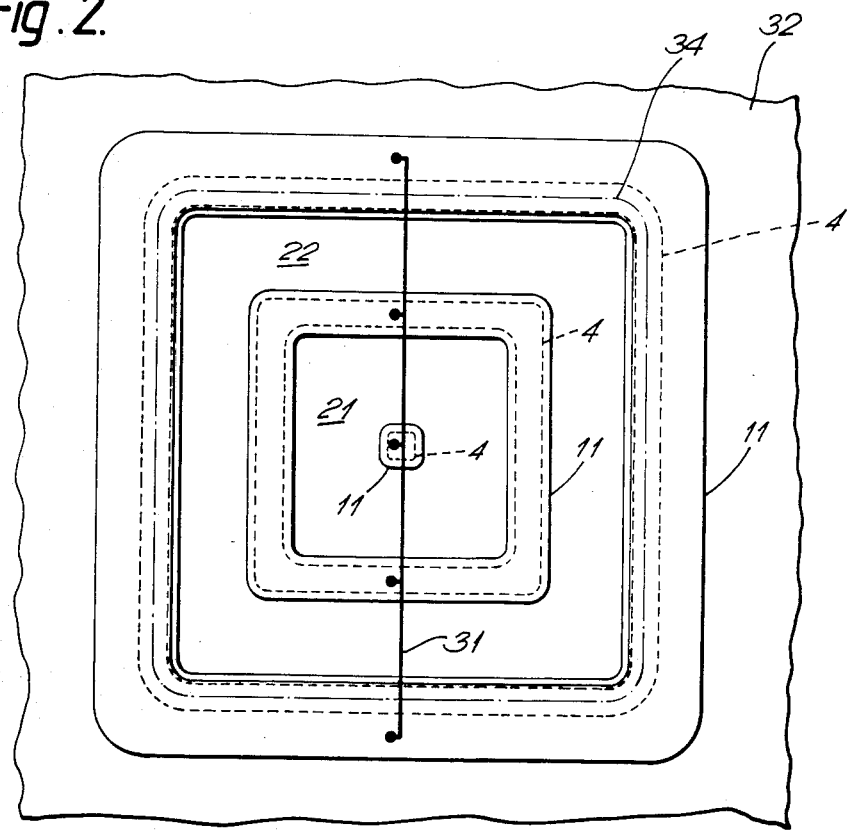
FIG. 2 is a plan view of the diode of FIG. 1.

The high voltage optically-switchable diode of FIGS. 1 and 2 comprises a semiconductor body 10 of, for example, monocrystalline silicon having first and second regions 1 and 2 respectively which are of one conductivity type (n-type in the example shown in FIG. 1). An optically-sensitive barrier region 3 is located between the first and second regions 1 and 2 to control current flow along a current path between electrode connections 11 and 12 to the first and second regions 1 and 2. The barrier region 3 contains a net impurity concentration of the opposite conductivity type (p-type in the example of FIG. 1) and is substantially fully depleted of free charge carriers formed with the first and second regions 1 and 2 at zero bias and in the absence of incident light. The barrier region 3 is therefore shown unhatched in FIG. 1, and it forms a negative space-charge region providing a potential peak or hump in the body 10 between the n-type regions 1 and 2. In the ON state of the diode the current flow across this barrier region 3 between the n-type regions 1 and 2 is by electrons, i.e. majority carriers in the regions 1 and 2.

In operation of the device of FIGS. 1 and 2 a bias voltage is applied to the electrode connections 11 and 12 across the barrier region 3. The first n-type region 1 is very highly doped (n++), whereas the second n-type region 2 has a much lower conductivity type determining doping concentration (n−) and a high resistivity. As a result, the barrier height of barrier region 3 to majority carriers (electrons) from the high resistivity region 2 when biased negative with respect to the region 1 is much less than the barrier height to majority carriers from the highly-doped region 1 when biased negative with respect to the region 2. Figure 1 therefore illustrates a reverse-bias situation for the barrier region 3 in which the region 2 is grounded and a negative voltage (−V) is applied to the region 1 via the connection 11. As will be described hereinafter, the device structure of FIGS. 1 and 2 also incorporates features in accordance with the present invention which permit the diode to block high reverse voltages (−V) and to be switched between this blocking state and an ON state by means of incident light 23.

In the example of FIGS. 1 and 2, there are apertures 21 and 22 in the top electrode connection 11 to form a concentric arrangement of annular optically transmissive windows 21 and 22 permitting incident light 23 to generate charge carriers in the vicinity of the barrier region 3. The barrier region 3 may be formed in a silicon body portion in which case incident light 23 of wavelengths in the near infra-red as well as wavelengths visible to the human eye can be used to generate electron-hole pairs in the vicinity of the barrier region 3. It should be noted that the expressions "optically-sensitive" and "light" as used in the present description and claims refer to any photon wavelengths which can be used to switch any particular device in accordance with the invention, regardless of whether those wavelengths are visible or invisible to the human eye.

The barrier height of the barrier region is reduced by minority carriers (holes in the example of FIG. 1) which collect in the barrier region 3 after being generated in the vicinity of the region 3 by the incident light 23. In acordance with the present invention, this effect is used to switch on the diode of FIGS. 1 and 2 from a high voltage blocking state. Furthermore, in order to achieve high voltage blocking characteristics, the diode has the following structure in accordance with the invention.

The barrier region 3 is divided laterally into plural areas located between closely-spaced field relief regions 4 which are of said opposite conductivity type (p-type) in the example of FIG. 1. As can be seen from the plan view of FIG. 2, in this specific example the field relief regions 4 and plural barrier-region areas are in a concentric annular arrangement in which the barrier-region area at window 22 extends laterally around the barrier-region area at window 21 and in which an intermediate annular field-relief region 4 is located between these two barrier-region areas. An outermost annular field-relief region 4 serves additionally as a guard-ring extending around the periphery of the whole barrier region 3 at a window in an insulating layer. At the center of the concentric arrangement there may be an innermost field-relief region 4 as illustrated in FIG. 2, or the center of the arrangement may be occupied by a barrier-region area surrounded by an annular innermost field-relief region 4. In FIG. 2 the field-relief regions 4 are in broken outline whereas the edges of the overlying electrode connections 11 are shown as continuous lines. The edge of the window in the insulating layer 34 on the upper surface of the body 10 is shown by a chain-dot line 34 in FIG. 2. Although FIGS. 1 and 2 only show three regions 4 and two barrier-region areas, many more such regions and areas may be provided, especially for high current devices.

The p-type field-relief regions 4 protrude into the n-type second region 2 to a much greater depth than the barrier region 3, for example more than $10^2$ or even $10^3$ times deeper than the barrier region 3. In the absence of light 23 and with reverse bias of the barrier region 3 the diode of FIGS. 1 and 2 has a high voltage blocking characteristic due to the field-relief regions 4 being sufficiently closely spaced that depletion layers extending in the high resistivity second region 2 from neighboring field-relief regions 4 merge together under reverse-bias of the barrier region 3 to reduce the electrostatic field below the barrier region 3. This merging and the extent of the resulting depletion layer in the region 2 is illustrated in FIG. 1 by the unhatched part of the region 2 and by the broken outline 33. By this means the depletion layer 33 may extend to a depth in the region 2 more than, for example, ten times the separation between the field-relief regions 4. Lines of force resulting from depletion of the lightly-doped region 2 are terminated on the p+ regions 4, thus reducing the electric field onto the barrier region 3.

In the diode of FIGS. 1 and 2 the divided barrier-region areas extend laterally to the field-relief regions 4, and the electrode connections 11 to the first region 1 contact both the first region 1 and the field-relief regions 4. In this case, when the light 23 is switched off, minority carriers (holes, in the example of FIG. 1) collected in the barrier region 3 can be rapidly extracted via the regions 4 and the negatively biased connection 11 so that the diode will rapidly switch back from the ON state to the blocking state. To facilitate this connection the first region 1 is divided laterally into plural areas located between the field-relief regions 4 as illustrated in FIG. 1, and the apertured electrode layer 11 is located over the field-relief regions 4 and contacts peripheral portions of the plural first-region areas. However, when the light 23 is switched on to switch the diode from the blocking state to the ON state some of the generated minority carriers reaching the barrier region 3 will flow away via the connection 11, thus reducing the optical sensitivity of the barrier region 3. However this reduction in sensitivity can be compensated for by using a sufficiently high intensity of illumination 23 in order to maintain a rapid turn-on time for the device.

The diode of FIGS. 1 and 2 can be manufactured using known device technologies. Thus, for example, the region 2 may be formed by a high resistivity n-type epitaxial silicon layer on a high conductivity n-type monocrystalline silicon substrate 20 which forms part of the connection to the region 2. The field-relief regions 4 may be formed by a boron impurity diffusion or other localized doping technique at the surface of the epitaxial layer. After defining an active device window in an insulating layer 34 on the surface of the epitaxial layer, the barrier region 3 and n-type region 1 may be formed by ion implantation at the window. The barrier region 3 may be of the general type disclosed in U.S. Pat. No. 4,149,174, and similar processing steps may be used, apart from the different geometry for the dopant masks and greater dimensions for the depth of the p-type regions 4 and for the areas of the barrier region 3 and first region 1. The whole contents of U.S. Pat. No. 4,149,174 are hereby incorporated by reference as background material into the present description. As described in U.S. Pat. No. 4,149,174 the, thickness and doping level of the barrier region 3 must satisfy certain conditions in order to maintain the region 3 fully depleted at zero bias in the absence of light.

In one particular example of the diode of FIGS. 1 and 2, the region 2 may have an arsenic doping concentration of about $10^{14}$ cm$^{-3}$ resulting in a resistivity of about 40 ohm.cm., and the epitaxial layer may be 80 micrometers thick. The field-relief regions 4 may be about 5 to 25 micrometers deep with a surface doping concentration of $10^{19}$ cm$^{-3}$. The barrier region 3 may be formed by implantation of 4.5 keV boron ions in a dose of $5\times10^{13}$ cm$^{-2}$. The first region 1 may be formed by implantation of 10 keV arsenic ions in a dose of $5\times10^{14}$ cm$^{-2}$. There may be a spacing of 10 to 25 micrometers between edges of adjacent regions 4. The insulating layer 34 may be of, for example, of silicon dioxide, and the electrode layers 11 and 12 may be of aluminum The separate electrode areas of the layer 11 may be connected together electrically by wires 31.

FIG. 3 illustrates a modification of the diode of FIGS. 1 and 2 which involves separating the plural barrier-region areas 3 laterally from the field-relief regions 4 by areas 8 of the high resistivity second region 2. In this case, discrete barrier regions 3 each extending to the semiconductor surface are formed locally between the field-relief regions 4, instead of doping through the whole window in the insulating layer 34 to form the barrier region 3 of FIGS. 1 and 2 which is divided up by the field-relief regions 4. The apertured electrode layer 11 forms a substantially ohmic contact to the regions 1 and 4 but is separated from the barrier region 3 by an intermediate insulating layer 24. In this device minority carriers (holes) generated by the incident radiation 23 cannot escape so easily from the barrier region 3 which enhances the optical sensitivity of the barrier region 3 and hence the switching speed of the device from the blocking state to the ON state when illumination 23 is switched on. However, the switching speed from the ON state to the blocking state will be slower because these minority carriers cannot be extracted so easily via the electrode 11.

It will be evident that many other modifications are possible within the scope of the present invention. Thus, for example, instead of a deep diffusion of the field-relief regions 4 from a plane upper surface of the body 10, grooves may be etched first in the surface when the regions 4 are to be formed, after which the regions 4 penetrating to the same depth as in FIGS. 1 and 3 may be provided by a shallower doping. The grooves may be of any suitable form, for example a U-shaped cross-section or V-shaped cross-section. Furthermore, the field relief regions need not comprise semiconductor regions of said opposite conductivity type which form p-n junctions with the second region 2. Thus, FIG. 4 illustrates a modification in which no p-type semiconductor regions 4 are provided, but the electrode layer 11 instead provides the field-relief means by forming a rectifying Schottky barrier with high resistivity areas 8 of the region 2 over the side-walls of grooves 44. Further, instead of a Schottky barrier, the side-walls of the grooves 44 may be provided with a thin insulating layer overlaid by the electrode layer 11 to form the field-relief regions as MIS capacitive field-effect structures. It is also possible to form the field-relief regions by providing in grooves 44 a semi-insulating layer (for example, of a mixture of polycrystalline silicon and silicon oxide) which forms a barrier with the side-walls of the groove so as to form the depletion layers in region 2 under reverse bias.

Instead of a concentric annular configuration for the field-relief regions 4 and barrier-region areas 3, other geometries, for example a mesh or grid arrangement or polygonal array may be employed. A series of spaced concentric guard rings which surround the active device window may also be provided in the region 2 and may be formed by the same technology as the field-relief regions 4. Furthermore, although the examples described are suitable for forming the barrier-region areas 3 and first-region areas 1 by dopant ion implantation, other structures may be designed in which the barrier-region areas and first-region areas are formed as doped layers by molecular beam epitaxy.

The device examples of FIGS. 1 to 4 are of diodes. However the present invention may also be employed in more complex device region structures, for example optically switchable transistors or thyristors or integrated circuits, in which the optically-sensitive barrier-region areas (with field-relief regions) are located in a current path between first and second regions to control switching of current in the device between an ON state and a high voltage blocking state.

I claim:

1. A semiconductor device comprising a semiconductor body having first and second regions of a first conductivity type, electrode connection to said first and second region, and an optically-sensitive barrier region located between the first and second regions at a given depth in said body to control current flow along a current path between said electrode connections to the first and second regions, which barrier region contains a net impurity concentration of the second, opposite conductivity type and is at least substantially fully depleted of free charge carriers by depletion layers formed with the first and second regions at zero bias and in the absence of incident light, optically transmissive means for permitting incident light to generate charge carriers in the vicinity of the barrier region to reduce the barrier height of the barrier region, and closely-spaced field-relief regions, the barrier region being divided laterally into plural areas located between said closely-spaced field-relief regions, which field-relief regions protrude to a greater depth in the body than that of the barrier region, and, in the absence of incident light and with reverse bias of the barrier region, the device having a high voltage blocking characteristic due to the field-relief regions being spaced such that depletion layers extending in the second region from neighboring field-relief regions merge together under reverse-bias of the barrier region to reduce the electrostatic field below the barrier region, the device being switchable between the high voltage blocking state and a current conducting state by means of incident light.

2. A semiconductor device as claimed in claim 1, further characterized in that the plural barrier-region areas are separated laterally from the field-relief regions by areas of the second region.

3. A semiconductor device as claimed in claim 1, further characterized in that the plural barrier-region areas extend laterally to the field-relief regions.

4. A semiconductor device as claimed in claim 3, further characterized in that the first region is divided laterally into plural areas located between the field-relief regions, and an electrode layer which contacts the field-relief regions and the plural first-region areas to make an electrical connection to the first region.

5. A semiconductor device as claimed in claim 1, 2 or 3, further characterized in that the first region is divided laterally into plural areas located between the field-relief regions, and an apertured electrode layer having optically transmissive apertures at the plural first-region areas for providing an electrical connection to said first region, said apertured electrode layer being located over the field-relief regions and contacting peripheral portions of the plural first-region areas.

6. A semiconductor device as claimed in claim 1, 2 or 3, further characterized in that the plural barrier-region areas are arranged in an annular configuration in which one said area extends laterally around another said area and in which an annular field-relief region is located between the barrier-region areas.

7. A semiconductor device as claimed in claim 1, 2 or 3, further characterized in that the field-relief regions comprise semiconductor regions of said opposite conductivity type forming p-n junctions with the second region.

8. A semiconductor device as claimed in claim 1, 2 or 3, further characterized in that the field-relief regions are formed at grooves which penetrate into the second region from a major surface of the body.

9. A semiconductor device as claimed in claim 8, further characterized in that an electrode layer which provides an electrical connection in the first region forms a Schottky junction with the second region in the grooves to provide the field-relief regions.

* * * * *